US009166593B2

(12) United States Patent
Park et al.

(10) Patent No.: US 9,166,593 B2
(45) Date of Patent: Oct. 20, 2015

(54) FLEXIBLE, SPACE-EFFICIENT I/O CIRCUITRY FOR INTEGRATED CIRCUITS

(71) Applicant: Baysand Inc., Morgan Hill, CA (US)

(72) Inventors: Jonathan C Park, San Jose, CA (US); Yin Hao Liew, Penang (MY); Kok Seong Lee, Penang (MY); Salah M Werfelli, Morgan Hill, CA (US)

(73) Assignee: Baysand Inc., Morgan Hill, CA (US)

( * ) Notice: Subject to any disclaimer, the term of this patent is extended or adjusted under 35 U.S.C. 154(b) by 45 days.

(21) Appl. No.: 13/627,270

(22) Filed: Sep. 26, 2012

(65) Prior Publication Data

US 2014/0247525 A1    Sep. 4, 2014

Related U.S. Application Data

(60) Provisional application No. 61/652,320, filed on May 28, 2012.

(51) Int. Cl.
*H02H 9/00* (2006.01)
*H03K 19/173* (2006.01)
*H01L 23/00* (2006.01)

(52) U.S. Cl.
CPC .......... *H03K 19/1732* (2013.01); *H01L 24/06* (2013.01); *H03K 19/1736* (2013.01); *H01L 2224/05553* (2013.01)

(58) Field of Classification Search
CPC ............ H01L 27/11898; H01L 24/06; H03K 19/1732; H03K 19/1736
USPC ........................................................ 257/203
See application file for complete search history.

(56) References Cited

U.S. PATENT DOCUMENTS

| 5,760,428 | A | 6/1998 | Colwell et al. | |
| 6,289,496 | B1 | 9/2001 | Anderson et al. | |
| 6,480,026 | B2 | 11/2002 | Andrews et al. | |
| 7,323,788 | B2* | 1/2008 | Miyaki et al. | 257/784 |
| 7,342,317 | B2* | 3/2008 | Ho et al. | 257/774 |
| 7,345,507 | B1 | 3/2008 | Young et al. | |
| 7,378,868 | B2 | 5/2008 | Tyhach et al. | |
| 7,872,283 | B2* | 1/2011 | Matsuoka | 257/203 |
| 8,395,903 | B1 | 3/2013 | Wu et al. | |
| 2003/0127717 | A1* | 7/2003 | Fang | 257/678 |
| 2005/0077634 | A1 | 4/2005 | Seaman et al. | |
| 2006/0186917 | A1 | 8/2006 | May et al. | |

* cited by examiner

*Primary Examiner* — Thienvu Tran
*Assistant Examiner* — Tien Mai
(74) *Attorney, Agent, or Firm* — Useful Arts IP

(57) ABSTRACT

Flexible, space-efficient I/O architectures for integrated circuits simplify circuit design and shorten design times. In one aspect, cells for power supply pads are eliminated, in part by locating ESD protection circuitry for these pads underneath the pads themselves, leaving only signal I/O buffers. Pads coupled to the signal I/O buffers may be defined as either signal I/O pads or power supply pads in accordance with customization circuitry. Customization circuitry also provides for flexible bank architectures, where signal I/O buffers within a bank share power supply requirements that may be different from power supply requirements of signal I/O buffers of another bank. The number of banks and the number of signal I/O buffers belonging to each bank is flexibly defined. Customization circuitry also provides for flexible pad options, whereby the IC pads may be configured for different packaging technology, for example, for wire bonding for flip-chip bonding, or for other types of bonding.

13 Claims, 13 Drawing Sheets

FLEXIBLE, SPACE-EFFICIENT I/O CIRCUITRY FOR INTEGRATED CIRCUITS

BACKGROUND

1. Field of the Invention

The present invention relates to I/O circuitry for integrated circuits.

2. State of the Art

Complex integrated circuits are often I/O-limited, meaning that the die size is increased beyond what would otherwise be required in order to accommodate the required number of I/Os. For integrated circuits generally, and especially I/O-limited integrated circuits, design of the I/O portion of the integrated circuit is often laborious and time-consuming. At the same time, short product design cycles call for short integrated circuit design cycles. Reducing design time and labor for integrated circuits, including complex, I/O limited integrated circuits, requires new approaches.

FIG. 1 shows a top view of the layout of a portion 300 of I/O circuitry of an example IC die, according to the prior art. I/O circuitry 300 could run along any edge of the periphery of an IC die. The I/O circuitry 300 uses two concentric rows of bond pads, i.e., inner pad row 1 and outer pad row 2. The pad placements along the peripheral edge are offset between the two rows. During the wire bonding process, all pads along the outer row 2 are typically wire bonded before any bond pads on inner row 1 are wire bonded (or vice versa). This arrangement enables I/O pads to be packed more densely without exceeding the capabilities (minimum pad pitch) of wire bonding equipment.

Bond pads in FIG. 1 include signal bond pads (SIG) 201 and power/ground bond pads. Power/ground bond pads in turn include power bond pads (VCC CORE) 204 for a core logic portion of the integrated circuit, ground bond pads (VSS CORE) 205 for the core logic portion of the integrated circuit, power bond pads (VCC IO) 202 for the I/O portion of the integrated circuit, and ground bond pads (VSS IO) 203 for the IO portion of the integrated circuit. Each of the foregoing pads is coupled to a corresponding one of I/O cells 130, including differentiated signal I/O cells (SIG IO) 211, core logic power I/O cells (VCC CORE) 214, core logic ground cells (VSS CORE) 215, I/O power cells (VCC IO) 212, and I/O ground cells (VSS IO) 213. A primary function of the four power/ground cells 130 is to provide electrostatic discharge (ESD) protection to the associated power/ground pads and supply power and ground to a group of I/O cells (SIG IO) 211.

Each of the cells 130 occupies an I/O slot, the I/O slots being spaced apart according to a specified pitch. For a complex integrated circuit, roughly 30% of the I/O pads will typically be power/ground pads, and a corresponding proportion of the cells 130 will be power/ground cells.

BRIEF DESCRIPTION OF THE DRAWING FIGURES

The present invention may be further understood from the following Detailed Description in conjunction with the appended drawing figures. In the drawing.

DETAILED DESCRIPTION

Summary

Flexible, space-efficient I/O architectures for integrated circuits simplify circuit design and shorten design times. In one aspect, cells for power supply pads are eliminated, in part by locating ESD circuitry for these pads underneath the pads themselves, leaving only signal I/O buffers. Pads coupled to the signal I/O buffers may be defined as either signal I/O pads or power supply pads in accordance with customization circuitry. Customization circuitry also provides for flexible bank architectures, where signal I/O buffers within a bank share power supply requirements that may be different from power supply requirements of signal I/O buffers of another bank. The number of banks and the number of signal I/O buffers belonging to each bank is flexibly defined. Customization circuitry also provides for flexible pad options, whereby the IC pads may be configured, for example, for wire bonding, for flip-chip bonding, or for other types of bonding.

Description

Flexible, Space-Efficient Layout

Figure 1:
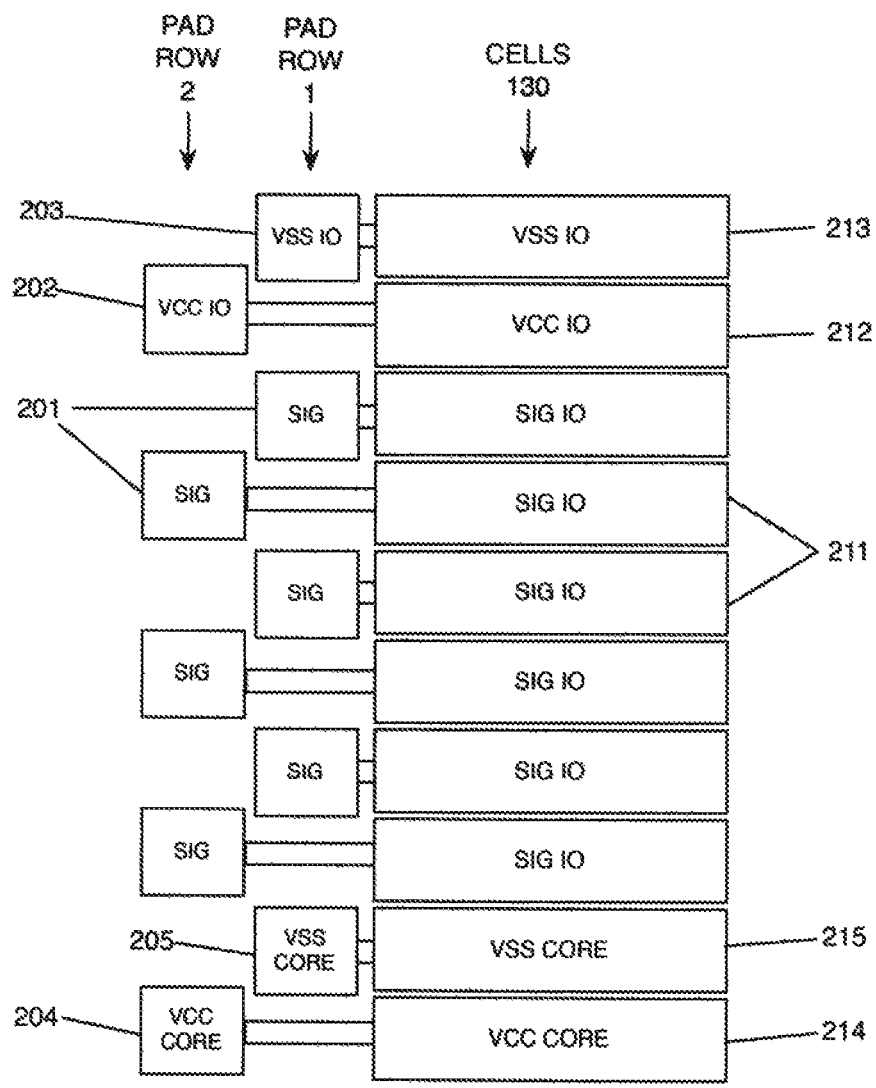
FIG. 1 is a diagram of a portion of known I/O circuitry of an integrated circuit.

One aspect of the present flexible, space-efficient I/O circuitry involves the elimination of the power/ground cells of FIG. 1.

Figure 2:
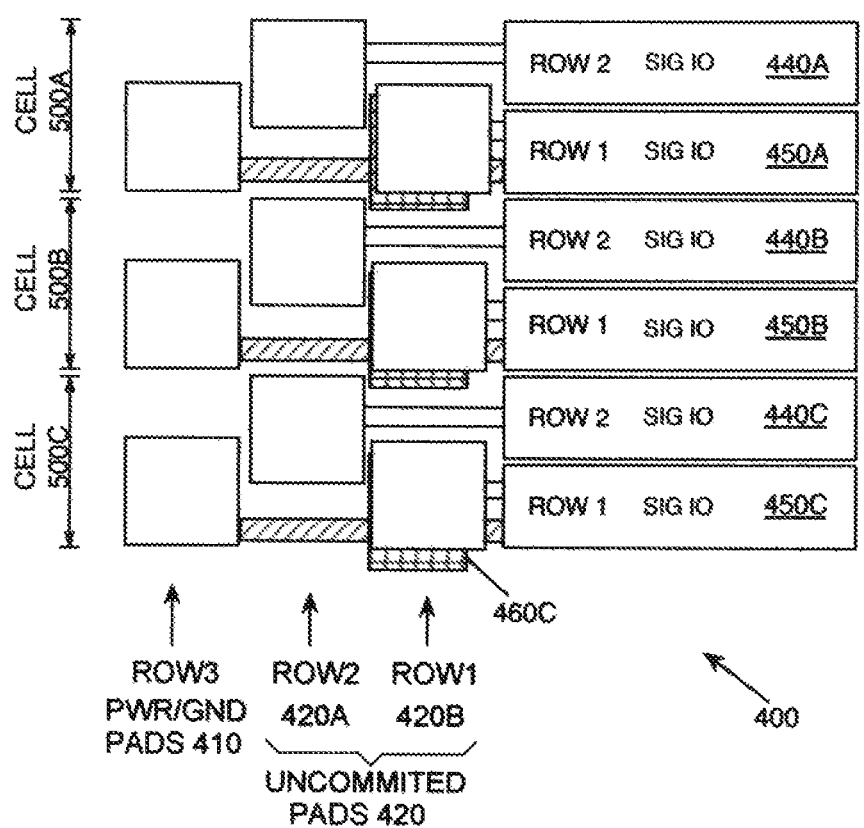
FIG. 2 is a diagram of a portion of flexible, space-efficient I/O circuitry of an integrated circuit.

Referring to FIG. 2, a diagram is shown of a top view of the layout of a portion 400 of I/O circuitry of an IC. I/O circuitry 400 includes an outer row 410 (i.e., row 3) of three power/ground pads. I/O circuitry 400 also includes a middle row 420A (i.e., row 2) of three uncommitted pads, and an inner row 420B (i.e., row 1) of three uncommitted pads. Many of uncommitted pads 420 will be mask programmed (i.e., programmed, committed, configured, or personalized) so as to handle I/O signals. Some may go unused, and some may be used for a power/ground line. I/O circuitry 400 also includes three electrostatic discharge (ESD) protection circuits, e.g., ESD protection circuit 460C, one of which is electrically connected with each of the three power/ground pads 410.

I/O circuitry 400 also includes six signal (SIG) I/O cells, or I/O buffers. These include three ROW 1 SIG I/O cells 450A, 450B and 450C that are electrically connected to the three uncommitted pads 420B on row 1. The SIG I/O cells also include three ROW 2 SIG I/O cells 440A, 440B and 440C that are electrically connected to the three uncommitted pads 420A on row 2. Thus, each uncommitted pad 420 is electrically connected with either a cell 440 or a cell 450. I/O circuitry 400 positions bond pads in a staggered, three-row scheme. The pad positions align, along the peripheral edge of the die, between inner row 1 and outer row 3. The pad positions are staggered (i.e., offset) between middle row 2 and the pads of both row 1 and row 3.

Each of the three power/ground pads 410 is electrically connected with a corresponding instance of ESD protection circuits 460. Each ESD protection circuit 460 is positioned substantially underneath one or more of the uncommitted pads 420. In this manner, the I/O circuitry 400 advantageously eliminates the need for any power/ground periphery cells. Thus, the I/O circuitry 400 advantageously reduces the required I/O die area for pad limited ICs.

The function of each of the six SIG I/O cells 440 or 450 may be determined by means of mask programming. Each cell's function can be determined independently of the function of any other SIG I/O cell. In the case of a mask programmable IC, an initial portion of the wafer fabrication process is controlled via a set of masks called lower masks. A later portion of the wafer fabrication process is controlled by means of a set of masks called late masks. For example, a modern IC might use 30 or 40 different masks at different steps in its wafer fabrication process, whereas only between one and, for example, four masks might be needed to customize each specific IC design.

During the late portion of the wafer fabrication process, mask programming determines the functionality of each instance of SIG I/O cell 440 or 450. In one embodiment, the function of each of those cells that is independently selectable by mask programming can be selected from the following set of functions: i) receiving an input signal from the particular uncommitted pad 420 that corresponds to that particular instance of a SIG I/O pad; ii) providing an output signal to a pad 420; iii) both receiving an input signal and providing an output signal to a pad 420; or iv) connecting a pad 420 to one of the power/ground lines within the IC. In various embodiments of the invention, cells like the SIG I/O cells described may have mask programmability of a larger range in its set of functions, or of a smaller range.

Uncommitted pads 420 within I/O circuitry 400 can be mask programmed by means of changing only the late masks. This mask programmability feature advantageously provides highly flexible support for a wide variety of IC designs.

Flexible Pad Assignment

Figure 3:
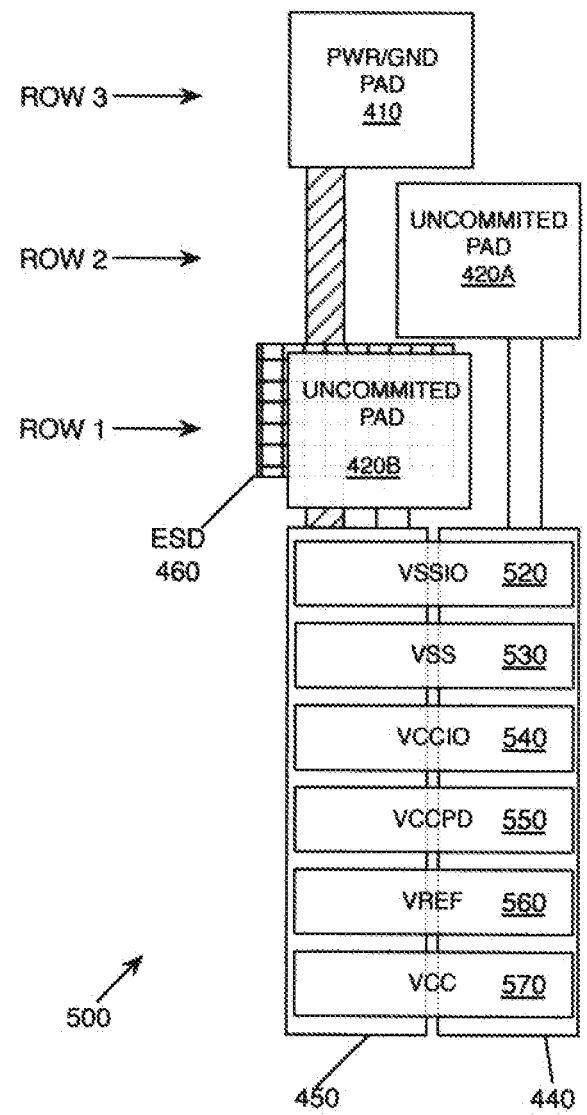
FIG. 3 is a top view of the layout of a single periphery cell of the I/O circuitry of FIG. 2.

In the illustrated embodiment, I/O circuitry 400 is implemented as three instances 500A, 500B and 500C of a periphery cell, each instance of which is identical except for its mask programming. Instances of periphery cell 500 may be the only cells that occur on the peripheral edge of the die. Referring to FIG. 3, a top view is shown of the layout of a single periphery cell 500, according to one embodiment. In the illustrated embodiment, periphery cell 500 includes: one uncommitted pad 420A that is positioned on row 2; one uncommitted pad 420B that is positioned on row 1; one uncommitted power/ground pad 410; one ESD protection circuit 460 may be electrically connected with the uncommitted power/ground pad; one SIG I/O cell 440 may be electrically connected to uncommitted pad 420A; and one SIG I/O cell 450 may be electrically connected to uncommitted pad 420B. Periphery cell 500 also includes a number of power/ground lines that run parallel to the peripheral edge of the die. In the embodiment shown in FIG. 3, these power/ground lines are: VSSIO 520, VSS 530, VCCIO 540, VCCPD 550, VREF 560, and VCC 570. Each of these power/ground lines may be electrically connected to uncommitted power/ground pad 410. The number of power/ground lines supported by the periphery cell may of course vary. Similarly, the functional nature and the nomenclature of those power/ground lines may vary.

Each of the power/ground lines of each particular instance of periphery cell 500 is mask programmable such that the line may extend across and be shared by a variable number of multiple peripheral cells, or may extend only within the confines of a single peripheral cell. In this manner, inter-cell connectivity of each power/ground line can be mask programmed (i.e., programmed, committed, or personalized), by means of changing only the late masks. This mask programmability advantageously provides highly flexible support for a wide variety of IC designs.

Figure 4A:
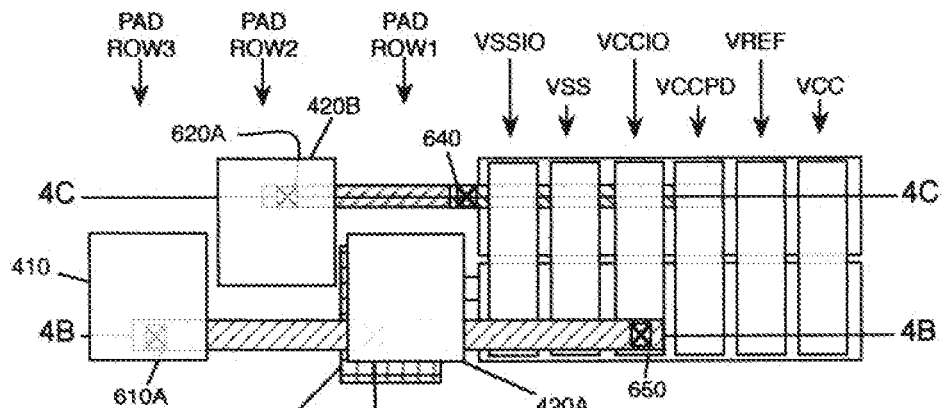
FIG. 4A is a top view of the layout of an instance of the periphery cell of the I/O circuitry of FIG. 2 following mask programming.
Figure 4B:
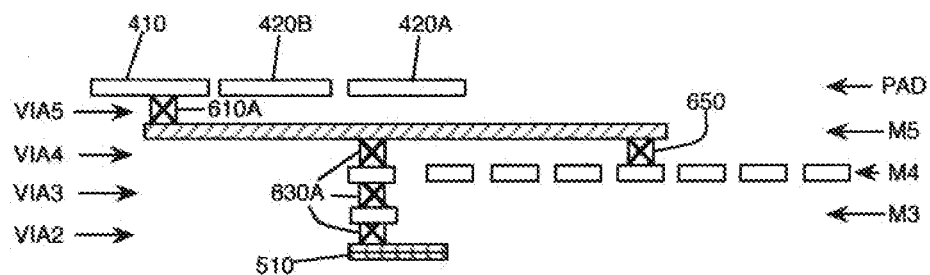
FIG. 4B is a cutaway view of the periphery cell of FIG. 4A.

Referring to FIG. 4A, a top view is shown of the layout of a single periphery cell, according to one embodiment. FIG. 4B is a cutaway side view of the same periphery cell of FIG. 4A, with the cut made on cut line 4B. Similarly, FIG. 4C is a cutaway side view of this same periphery cell, with the cut made on cut line 4C.

FIGS. 4A and 4B show how power/ground pad 410 is mask programmed to electrically connect with the VCCIO power line within the periphery cell shown. This connection passes down through via 610A on via layer VIA5. This connection continues along a metal run on metal layer M5, then down through via 650 to the VCCIO power line on metal layer M4. FIGS. 4A and 4B also show how power/ground pad 410 is mask programmed to connect with ESD protection circuit 510 within this periphery cell. This electrical connection passes down through three vias 630A, each of which is on one of via layer VIA4, via layer VIA3, or via layer VIA2.

Figure 4C:
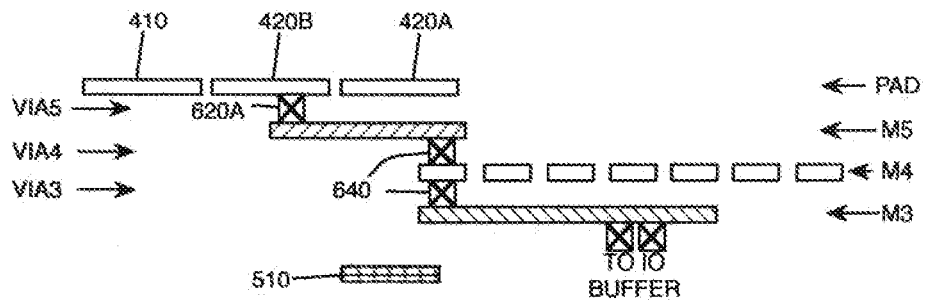
FIG. 4C is another cut-away view of the periphery cell of FIG. 4A.

FIGS. 4A and 4C show how uncommitted pad 420B is mask programmed to electrically connect with its corresponding I/O buffer within the periphery cell. This connection passes down through via 620A on via layer VIA5, then along a metal run of metal layer M5, then down through vias 640 of via layers VIA4 and VIA5, then along a metal run on metal layer M3, then down through one or more vias into the I/O buffer.

Figure 4D:
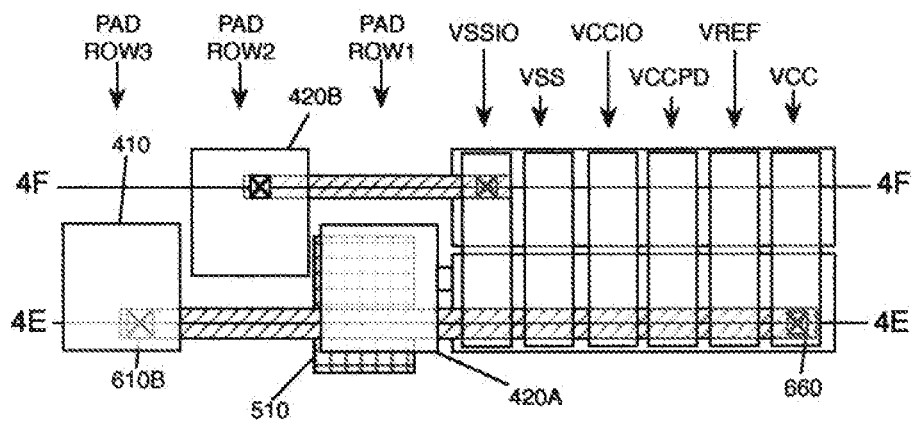
FIG. 4D is a top view of the layout of another instance of the periphery cell of the I/O circuitry of FIG. 2 following mask programming.
Figure 4E:
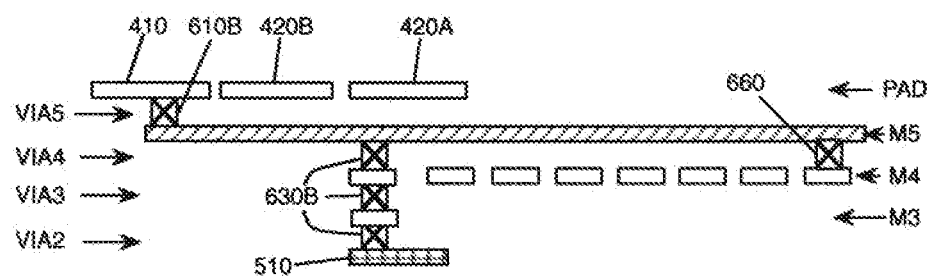
FIG. 4E is a cut-away view of the periphery cell of FIG. 4D.
Figure 4F:
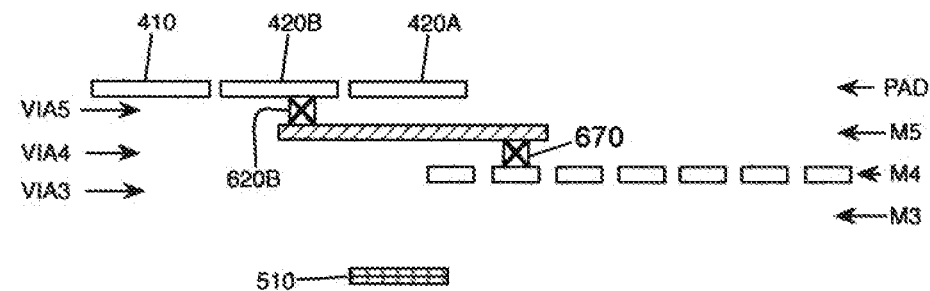
FIG. 4F is another cutaway view of the periphery cell of FIG. 4D.

FIG. 4D-4F show corresponding views of another single periphery cell, according to one embodiment. Note that this periphery cell has different mask programming than that of the cell in FIG. 4A, although these two cells have the same initial masks, and thus the same uncommitted potential functional capabilities.

FIGS. 4D and 4E show how power/ground pad 410 is mask programmed to electrically connect with the VCC power line within this periphery cell (in contrast to the VCCIO power line as shown in FIGS. 4A and 4B). This connection passes down through via 610B of layer VIA5, then along a metal run on metal layer M5, then down through via 660 to the VCC power line on metal layer M4. FIGS. 4D and 4E also show how power/ground pad 410 is mask programmed to electrically connect with ESD protection circuit 510 within this periphery cell. This electrical connection passes down through three vias 630B, each of which is on one of via layer VIA4, via layer VIA3, or via layer VIA2.

FIGS. 4D and 4F show how uncommitted pad 420B is mask programmed to connect with the power line VSSIO within this periphery cell. This electrical connection occurs by means of via 620B of via layer VIA5 and via 670 of via layer VIA4.

Considered together, FIGS. 4A, 4B, 4D, and 4E show how power/ground pad 410 can be mask programmed to connect with either of two specific ones of the power/ground lines within this periphery cell. By means of different mask programming, each power/ground pad in each particular instance of a periphery cell can be programmed to connect with any of the power/ground lines within that periphery cell. Thus, by means of different layouts for the late masks used for the metal and via layers shown in these figures, the I/O bank architecture (i.e., bank architecture or power architecture) can be advantageously and flexibility customized to support the particular functional requirements of the IC.

Similarly, FIGS. 4A, 4C, 4D, and 4F show how uncommitted pad 420B can be mask programmed to connect either with its corresponding I/O buffer or with one of the power lines. By means of different mask programming, any uncommitted pads that are not allocated to an I/O signal can be programmed to connect with any of the metal lines within any periphery cell. Additional pads connecting to a particular power line could improve the performance of the IC by helping to avoid switching induced transient voltages on that line.

Flexible I/O Banks

In a mode IC-based system, one portion of the system may operate at a relatively high voltage and low speed, for example, the data signals that connect the system with removable media or devices. An I/O standard is likely to also specify timing and speed parameters. These can be relevant when designing the I/O bank architecture of ICs that use that standard; for example, relatively fast signals consume relatively more current which requires a relatively larger ratio of power/ground pads to I/O signal pads within each I/O bank. At the same time and within the same system, another portion of the system may operate at a relatively low voltage and high speed, for example, the data signals that connect an IC with substantial processing capability to an IC with substantial memory capability. As market requirements and manufacturing capabilities evolve, older I/O standards are gradually phased out in favor of newer ones. Thus, some modern IC-based systems may have portions that operate in accordance with relatively recent I/O standards and some that operate in accordance with legacy I/O standards. Thus, there is a need for a wide variety of particular ICs that are easily customizable to handle a potentially wide variety of I/O standards. Examples of such I/O standards might include CMOS, LVCMOS, SSTL, ECL, LVDS, etc.

Figure 5A:
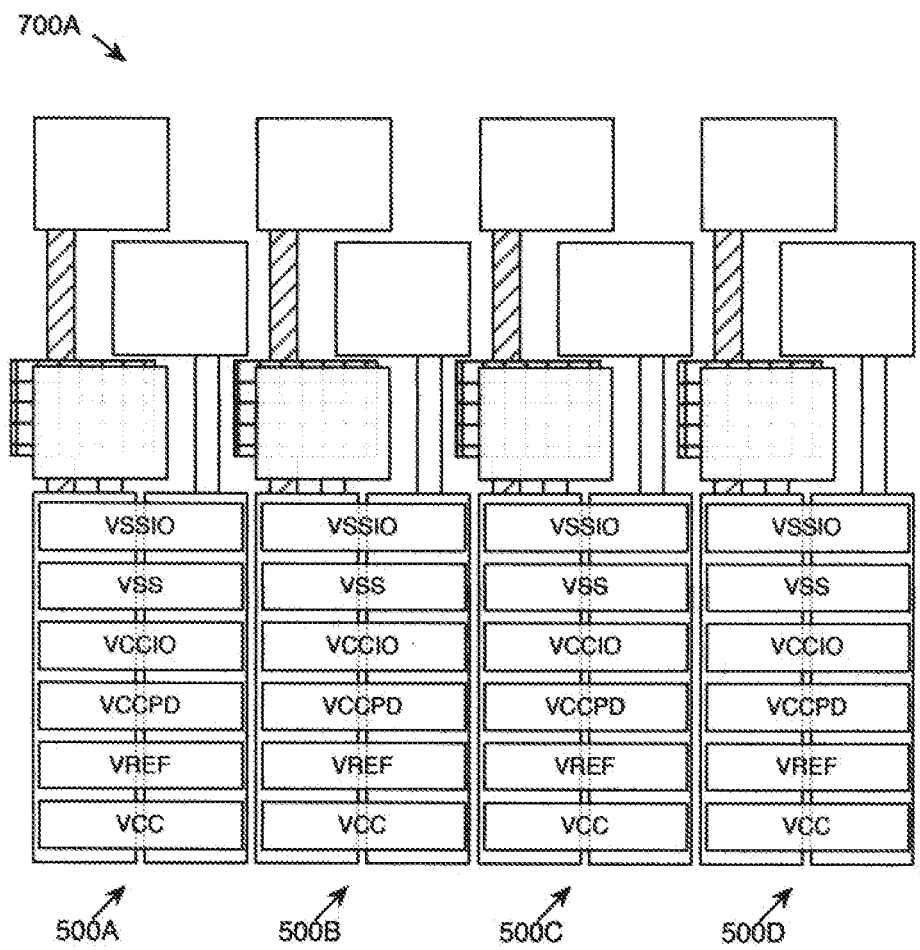
FIG. 5A is a diagram of a group of periphery cells, illustrating pad assignment in accordance with one mask programmed configuration.

Referring to FIG. 5A, a diagram is shown of I/O circuitry 700A, which contains instances 500A, 500B, 500C, and 500D of periphery cell 500. Similarly, FIGS. 5B and 5C, respectively, show I/O circuitry 700B and I/O circuitry 700C, each of which also contains instances 500A, 500B, 500C, and 500D of periphery cell 500. The different I/O circuits 700A, 700B and 700C are differentiated by different mask programming related to the six power ground lines within this cell, specifically the power/ground lines VSSIO, VSS, VCCIO, VCCPD, VREF, and VCC. The number of periphery cells in the I/O circuits 700A, 700B and 700C is exemplary only, and may be greater or less. The number of power/ground lines and their function is also exemplary only.

Figure 5B:
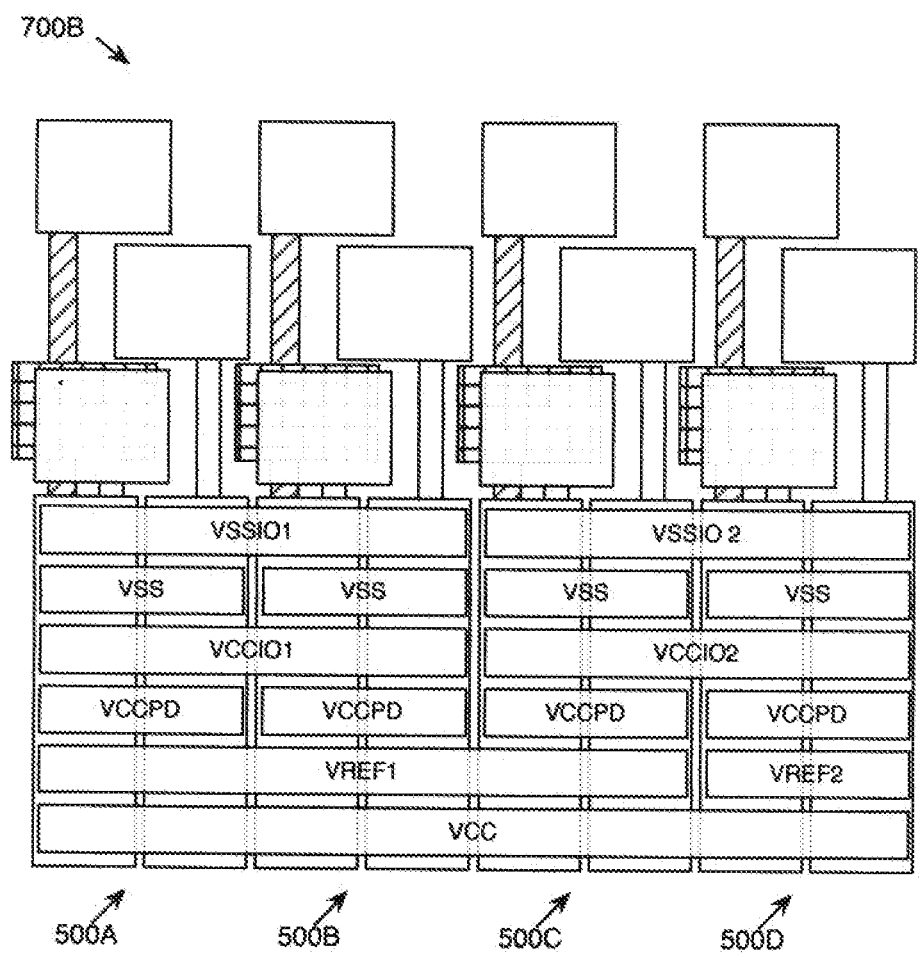
FIG. 5B is a diagram of a group of periphery cells, illustrating pad assignment in accordance with another mask programmed configuration.
Figure 5C:
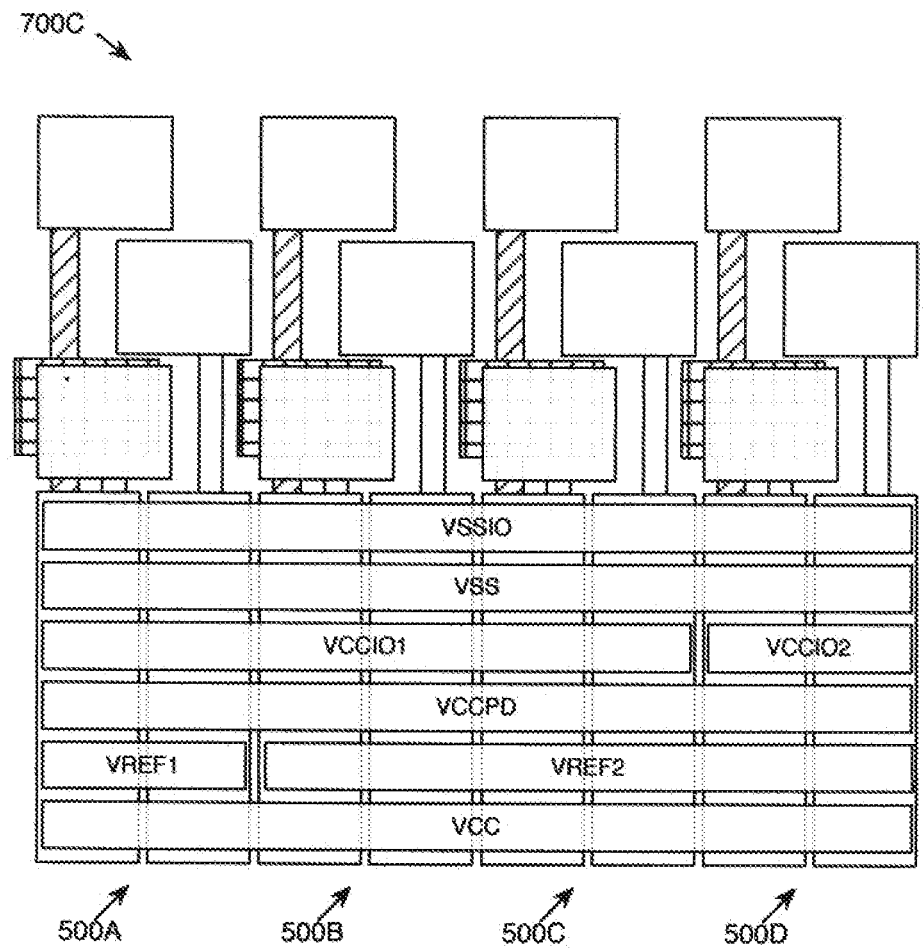
FIG. 5C is a diagram of a group of periphery cells, illustrating pad assignment in accordance with yet another mask programmed configuration.

FIGS. 5A, 5B, and 5C show how the mask programmability of the power/ground lines of periphery cell 500 is used to implement not only multiple I/O banks, but to mix and match reference voltages, such as VREF1 and VREF2, across I/O banks. Thus, the mask programmability of the power/ground lines of periphery cells according to embodiments of the invention advantageously supports significant flexibility in the design of a wide variety of I/O bank architectures for a wide variety of specific IC designs.

Figure 6A:
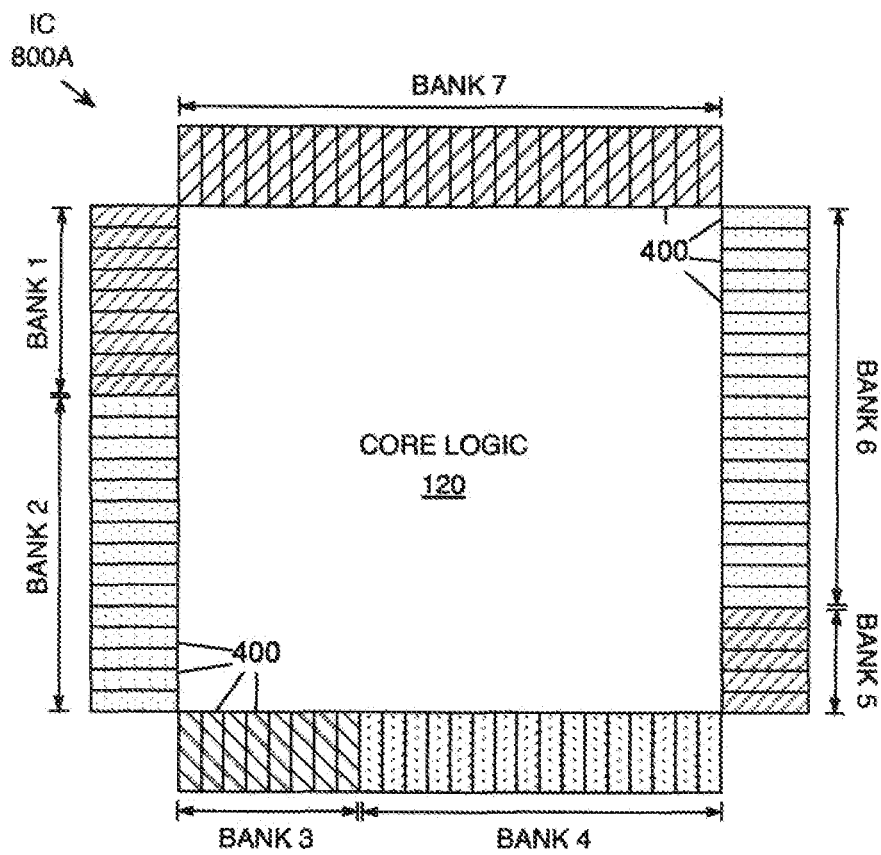
FIG. 6A is a plan view of an IC illustrating one mask-programmed I/O bank arrangement.
Figure 6B:
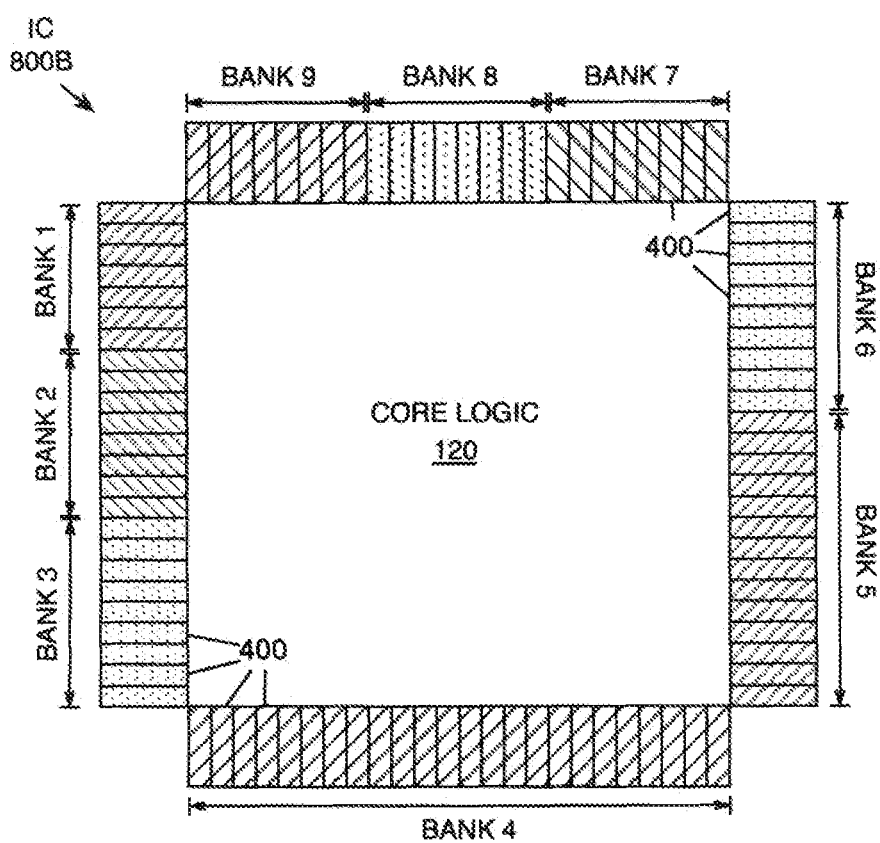
FIG. 6B is a plan view of an IC illustrating another mask-programmed I/O bank arrangement.

Referring to FIGS. 6A and 6B, FIG. 6A shows a top view of the entire layout of die 800A of an example IC, according to one embodiment. Similarly, FIG. 6B shows a top view of the entire layout of die 800B of a different example IC. In FIGS. 6A and 6B, each example die may use, for example, periphery cell 400 (FIG. 2). Periphery cell 400 includes six uncommitted pads, which are often used for I/O signals, as well as three power/ground pads. Uncommitted pads can be mask programmed for I/O signals. Alternatively, some (or even all) of those uncommitted pads can be mask programmed to help supply the power requirements of the die. Periphery cell 400 also includes three power/ground pads and six power/ground lines. Each power/ground pad can be independently mask programmed to connect to any of those six power/ground lines. Various other embodiments may use periphery cells of various designs, consistent with the principle described herein.

Each of the die 800A and 800B includes core logic 120. ICs 800A and 800B have quite different I/O bank architectures. (In the illustrated example, die 800A includes seven I/O banks of various numbers of I/Os, and die 800B includes nine I/O banks of various numbers of I/Os.) Each of these I/O architectures is determined via mask programming. Each of these I/O banks is independent of the others with respect to the I/O standard(s) used within that bank. Typically, different I/O standards will have different power supply requirements, which may be flexibly supported as illustrated and described previously in relation to FIGS. 5A-5C. FIGS. 6A and 6B illustrate the advantageous IC design flexibility supported by this aspect of the mask programmability of the present embodiment.

Flexible I/O Pad Bonding Options

Pad bonding options may include wire bonding, flip-chip bonding, or other types of bonding. Significantly, the choice between wire bond packaging and flip-chip packaging can be made late in the IC design cycle, or even after the IC design is finalized.

Figure 7:
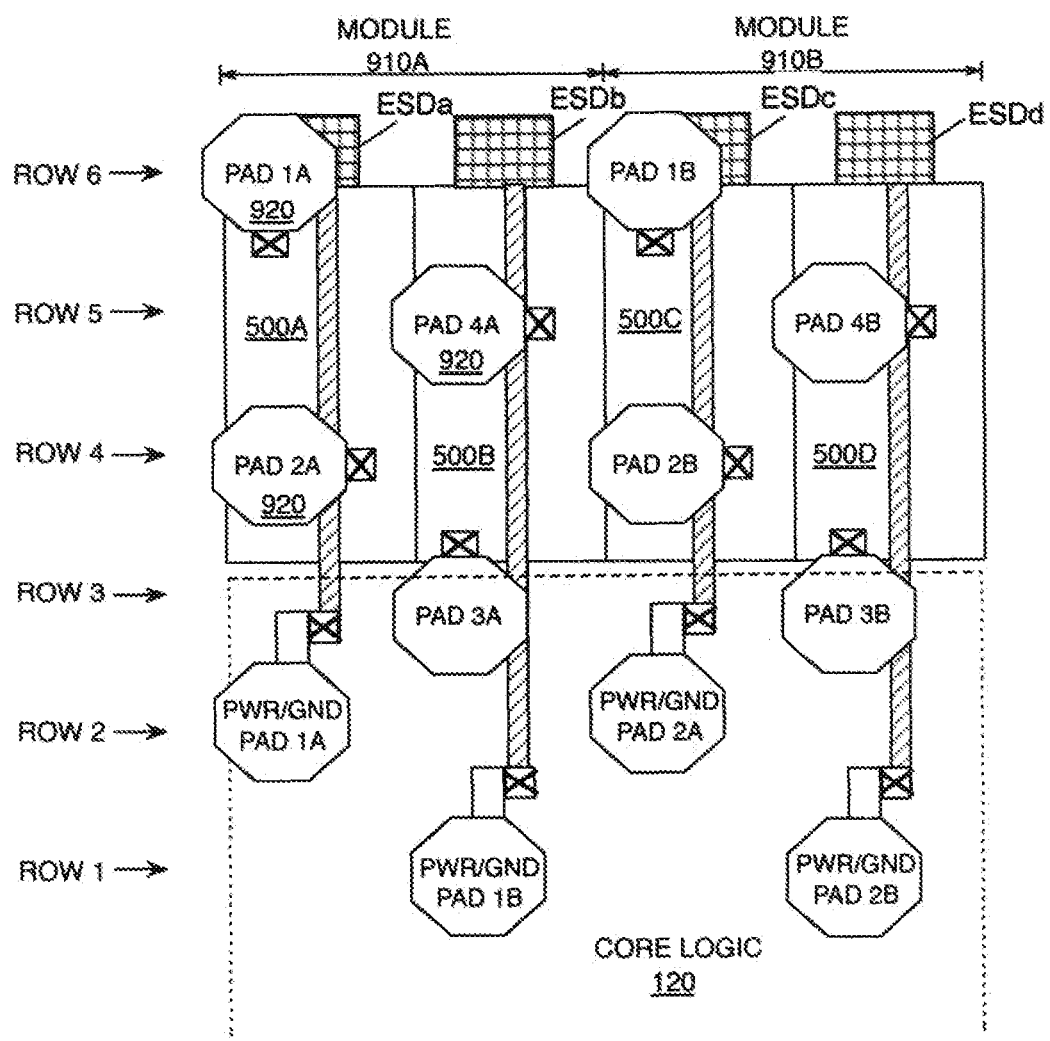
FIG. 7 is a diagram of I/O circuitry configured in accordance with a flip-chip mask programming option.

Referring to FIG. 7, a diagram is shown of I/O circuitry configured in accordance with a flip-chip pad option in which the pads are bump pads rather than wire bond pads. Instances of bump pads may overlie core logic—a substantial advantage of flip-chip packaging. Each periphery cell 500A, 500B, 500C and 500D includes a pair of I/O buffers like I/O buffers 440 and 450 (FIG. 3). While the buffer layout remains the same, the pad layout (defined by customization circuitry) is different. Odd numbered periphery cells (500A, 500C) have associated with them three bond pads including two uncommitted bond pads in rows 6 and 4 and one power/ground bond pad in row 2. An ESD protection circuit (ESDa, ESDc) abuts the I/O buffers of the periphery cell (500A, 500C) and partly underlies the bond pad in row 6. Whereas the ESD protection circuit (ESDa, ESDc) is centered on the periphery cell, the bond pad in row 6 is centered on a left half of the periphery cell. The power/ground bond pad in row 2 overlies a core logic area 120.

Even numbered periphery cells (500B, 500C) differ in that their bond pads are offset (staggered), being located in rows 1, 3 and 5. Odd and even-numbered periphery cells are paired to form a larger module; i.e., periphery cells 500A and 500B are paired to form a module 910A, and periphery cells 500C and 500D are paired to form a module 910B.

Figure 8A:
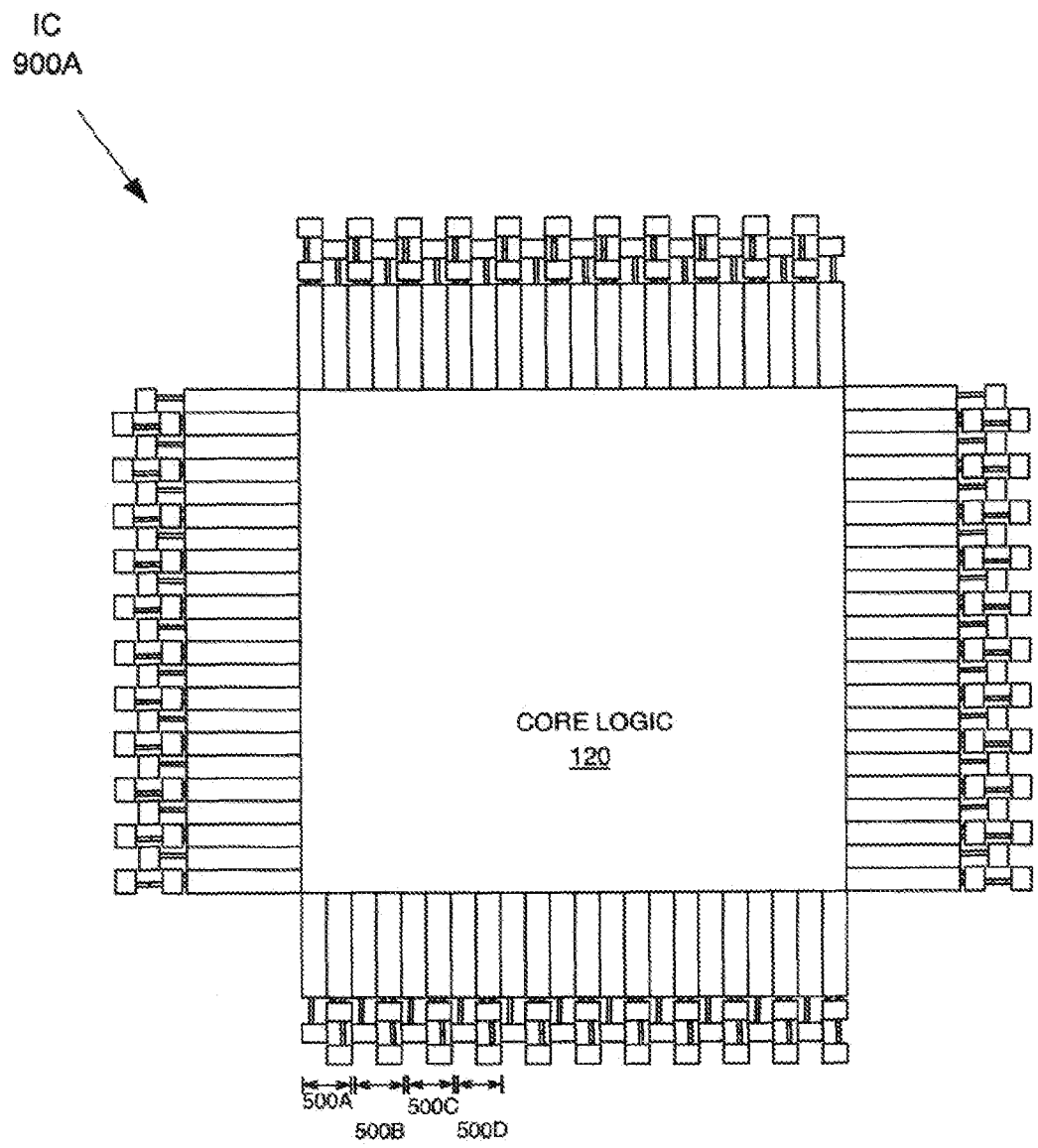
FIG. 8A is a diagram of an IC having I/O pads configured in accordance with a wire bonding mask programming option.
Figure 8B:
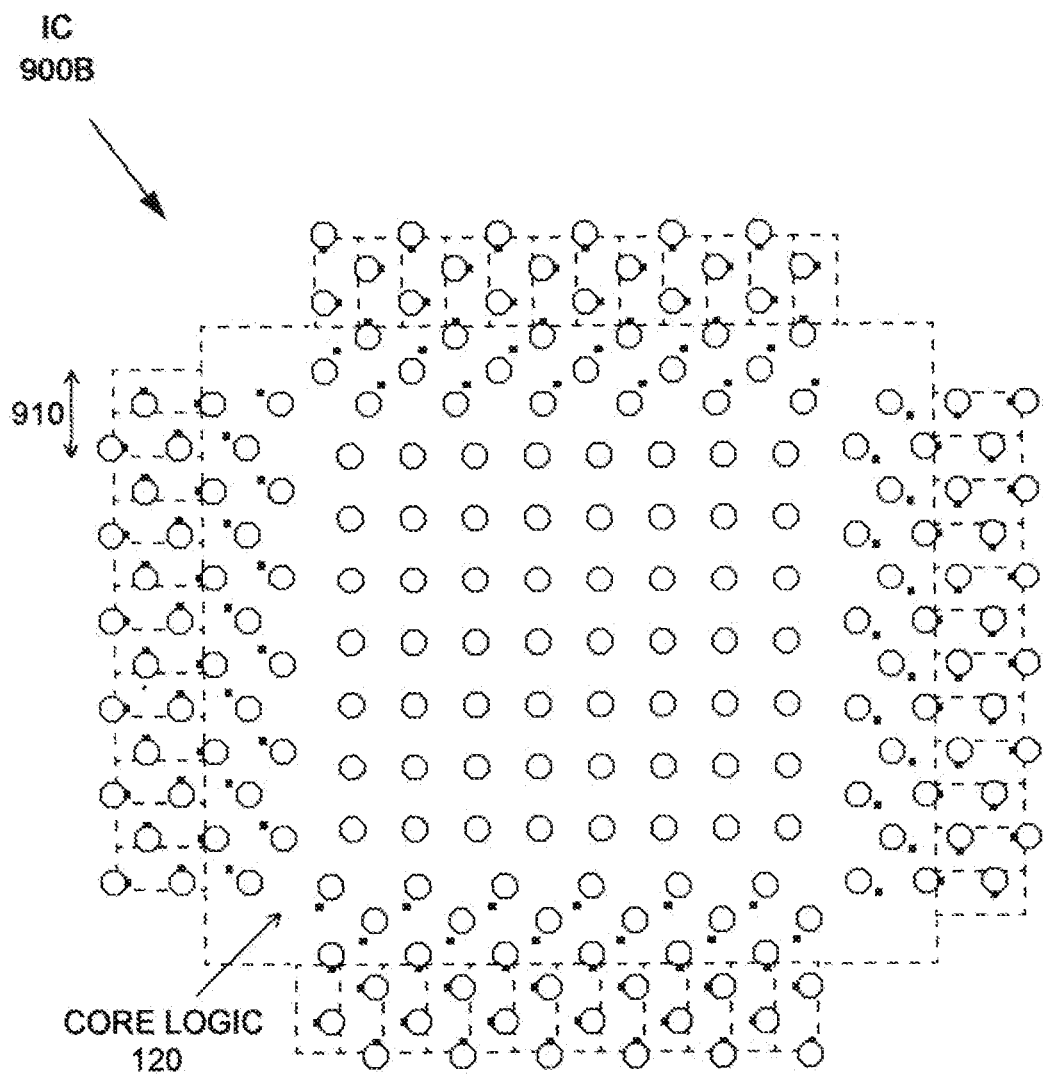
FIG. 8B is a diagram of an IC having I/O pads configured in accordance with a flip-chip bonding mask programming option.

Referring to FIGS. 8A and 8B, in FIG. 8A, a diagram is shown of a top view of the entire layout of a IC die 900A, according to one embodiment. Die 900A includes instances of periphery cell 500 along each of its four edges. In FIG. 8B, a diagram is shown of a top view of the entire layout of an IC die 900B, according to one embodiment. In FIG. 8A, periphery cells 500 are positioned to form a square, within which is positioned core logic 120. In FIG. 8B, periphery modules 910 are positioned to form a square, within which is positioned core logic 120.

Periphery cell 500, as used in die 900A, may contain three bond pads. Periphery module 910, as used in die 900B, may contain six bump pads such as bump pad 920 (FIG. 7). This alteration between periphery cell 500 and periphery module 910 is a simple matter of mask programming. Typically the minimum distance separating adjacent bump pads will be larger than the minimum separation required between bond pads.

In the case of both wire bond packaging and flip-chip packaging, any particular bond/bump pad can go unused in a particular specific IC design. Similarly, any particular uncommitted bond/bump pad can be mask programmed to be either a signal bond/bump pad, or a power/ground bond/bump pad.

As described in relation to the foregoing embodiments, periphery cells may be mask programmable in various ways, including but not limited to the ways explicitly described herein and shown in the accompanying figures. For example, periphery cells can be masked programmed to specify, relatively late in the wafer fabrication process some or all of the following: the choice between including bump pads or bond pads in the IC dies when the later wafer processing steps are completed; which uncommitted bond pads, or uncommitted bump pads, are used for input signals, which are used for output signals, which are used for bidirectional I/O signals, and which are used for a power/ground line; which uncommitted bond pads, or uncommitted bump pads, are used for input signals, which are used for output signals, which are used for bidirectional I/O signals, and which are used for a power/ground line; and a wide variety of functional characteristics within the core logic of the IC.

Such late mask programming can be employed to advantageously reduce manufacturing turn around time (TAT) when changes are made in the design of an IC that is implemented according to the described embodiments. This late mask programming can also advantageously reduce the cost incurred for each set of design changes, because only a few of the potentially many masks use to fabricate the IC need to be regenerated. These advantages can be realized whether such IC design changes are made to remove bugs or as a result of evolving product requirements.

Embodiments of the invention may take the form of methods of laying out the I/O portion of an integrated circuit, as well as non-transitory computer readable media containing instructions for accomplishing such layout. Various features of the present invention, including but not limited to periphery cells, mask programmable capabilities, and I/O banks can be represented in a variety of hardware description languages (HDLs). HDL descriptions may vary from low-level to high-level. A wide variety of HDLs are known in the art. A wide variety of computer systems are also known in the art. Using one or more HDLs, a design of an IC can be represented in a way that can be interpreted (i.e., processed, manipulated, compiled, synthesized, simulated, or transformed) by one or more computer systems.

As used herein, words of approximation, unless otherwise defined, are used to mean plus or minus ten percent of nominal value.

It will be apparent to those of ordinary skill in the art that the present invention can be embodied in other specific forms without departing from the spirit or essential character thereof. The foregoing description is therefore to be regarded as illustrative, not restrictive. The scope of the invention is defined by the appended claims, not the foregoing description, and all changes which some within the range of scope of equivalents thereof are intended to be embraced therein.

What is claimed is:

1. A metal programmable integrated circuit comprising a core logic portion and an I/O portion, the I/O portion comprising an I/O ring region located around a periphery of the core logic portion and an I/O pad region located outside the I/O ring region, the I/O portion comprising a plurality of repeatable I/O modules of uniform size, each comprising:
   within the I/O ring region, a first I/O buffer occupying a first I/O slot, and a second I/O buffer occupying a second abutting I/O slot, the first I/O slot and the second abutting I/O slot being located at a specified I/O slot pitch relative to one another;
   within the I/O pad region, a group of I/O pads located in line with the first I/O slot and the second I/O slot and comprising a first I/O pad coupled to the first I/O buffer, a second I/O pad coupled to the second I/O buffer, and a third I/O pad, wherein I/O pads of the group of I/O pads are staggered in relation to one another; and
   within the I/O pad region, an ESD protection circuit underlying at least one I/O pad of the group of I/O pads to provide ESD protection for the third I/O pad without increasing said I/O slot pitch.

2. The apparatus of claim 1, comprising customization circuitry configured for performing at least one of the following: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

3. The apparatus of claim 2, wherein the customization circuitry is configured for performing at least two of the following: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

4. The apparatus of claim 2, wherein the customization circuitry is configured for performing at least three of the following: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads anI/O standard; and defining multiple different banks of I/O pads, each I/O pad within a bank of I/O pads having the same I/O pad power supply requirements and I/O pads within different banks of I/O pads having different I/O pad power supply requirements.

5. A method of laying out an I/O portion of a metal programmable integrated circuit comprising a core logic portion and an I/O portion, the I/O portion comprising an I/O ring region located around a periphery of the core logic portion and an I/O pad region located outside the I/O ring region, the I/O portion comprising a plurality of repeatable I/O modules of uniform size, the method comprising:
  arraying within the I/O portion a plurality of flexible I/O modules, each flexible I/O module comprising:
    within the I/O ring region, a first I/O buffer occupying a first I/O slot, and a second I/O buffer occupying a second abutting I/O slot, the first I/O slot and the second abutting I/O slot being located at a specified pitch relative to one another;
    within the I/O pad region, a group of I/O pads located in line with the first I/O slot and the second I/O slot and comprising a first I/O pad coupled to the first I/O buffer, a second I/O pad coupled to the second I/O buffer, and a third I/O pad, wherein I/O pads of the group of I/O pads are staggered in relation to one another; and
    within the I/O pad region, an ESD protection circuit underlying at least one I/O pad of the group of I/O pads to provide ESD protection for the third I/O pad without increasing said I/O slot pitch.

6. The method of claim 5, further comprising customizing the I/O modules to perform at least one of: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

7. The method of claim 6, comprising customizing the I/O modules to perform at least two of: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

8. The method of claim 7, comprising customizing the I/O modules to perform at least three of: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

9. A non-transitory machine-readable computer medium for laying out an I/O portion of a metal programmable integrated circuit comprising a core logic portion and an I/O portion, the I/O portion comprising an I/O ring region located around a periphery of the core logic portion and an I/O pad region located outside the I/O ring region, the non-transitory machine-readable computer medium comprising instructions for defining a flexible I/O module comprising:
  within the I/O ring region, a first I/O buffer occupying a first I/O slot, and a second I/O buffer occupying a second abutting I/O slot, the first I/O slot and the second abutting I/O slot being located at a specified pitch relative to one another;
  within the I/O pad region, a group of I/O pads located in line with the first I/O slot and the second I/O slot and comprising a first I/O pad coupled to the first I/O buffer, a second I/O pad coupled to the second I/O buffer, and a third I/O pad, wherein I/O pads of the group of I/O pads are staggered in relation to one another; and
  within the I/O pad region, an ESD circuit underlying at least one I/O pad of the group of I/O pads to provide ESD protection for the third I/O pad without increasing said I/O slot pitch.

10. The apparatus of claim 9, comprising instructions for placing within the I/O portion of the integrated circuit a plurality of adjacent ones of said I/O module.

11. The apparatus of claim 10, comprising instructions for customizing the I/O modules to perform at least one of: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

12. The apparatus of claim 11, comprising instructions for customizing the I/O modules to perform at least two of: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

13. The apparatus of claim 12, comprising instructions for customizing the I/O modules to perform at least three of: defining at least one of the first, second and third I/O pads as either a power supply pad or a signal pad; defining at least one of the first, second and third I/O pads as an I/O pad for one of multiple different types of bonding, including at least wire bonding and flip-chip bonding; defining for at least one of the first, second and third I/O pads an I/O standard; and defining multiple different banks of I/O pads, each I/O pad within a bank of I/O pads having the same I/O pad power supply requirements and I/O pads within different banks of I/O pads having different I/O pad power supply requirements.

* * * * *